United States Patent
Chen et al.

(10) Patent No.: US 12,326,638 B2
(45) Date of Patent: Jun. 10, 2025

(54) PIXEL ELECTRODE, ARRAY SUBSTRATE AND DISPLAY DEVICE

(71) Applicants: Wuhan BOE Optoelectronics Technology Co.,Ltd., Wuhan (CN); BOE TECHNOLOGY GROUP CO., LTD., Beijing (CN)

(72) Inventors: Xiaoxiao Chen, Beijing (CN); Peng Jiang, Beijing (CN); Yuanhui Guo, Beijing (CN); Ning Zhu, Beijing (CN); Yun Li, Beijing (CN); Xia Shi, Beijing (CN); Jiantao Liu, Beijing (CN)

(73) Assignees: WUHAN BOE OPTOELECTRONICS TECHNOLOGY CO., LTD., Hubei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/639,030

(22) PCT Filed: Apr. 6, 2021

(86) PCT No.: PCT/CN2021/085622
§ 371 (c)(1),
(2) Date: Feb. 28, 2022

(87) PCT Pub. No.: WO2022/213256
PCT Pub. Date: Oct. 13, 2022

(65) Prior Publication Data
US 2024/0036426 A1    Feb. 1, 2024

(51) Int. Cl.
*G02F 1/1368*    (2006.01)
*G02F 1/1362*    (2006.01)
(Continued)

(52) U.S. Cl.
CPC ...... *G02F 1/1368* (2013.01); *G02F 1/136286* (2013.01); *H10D 86/441* (2025.01); *H10D 86/60* (2025.01)

(58) Field of Classification Search
CPC ......... G02F 1/133707; G02F 1/134372; G02F 1/1368; G02F 1/136286; G02F 1/133553;
(Continued)

(56) References Cited

U.S. PATENT DOCUMENTS 7,612,854 B2    11/2009    Kang
8,987,746 B2    3/2015     Chung et al.
(Continued)

FOREIGN PATENT DOCUMENTS

CN    1963606 A    5/2007
CN    1991556 A    7/2007
(Continued)

OTHER PUBLICATIONS

First Office Action for India Patent Application No. 202227043318 of Feb. 22, 2024.
(Continued)

*Primary Examiner* — Hoan C Nguyen
(74) *Attorney, Agent, or Firm* — Perilla Knox & Hildebrandt LLP; Kenneth A. Knox

(57) ABSTRACT

A pixel electrode, an array substrate, and a display device are provided. The pixel electrode includes: a first edge conductive part and a second edge conductive part arranged at intervals in a first direction, and a main conductive part at least partially located between the first edge conductive part and the second edge conductive part. The main conductive part is respectively connected to the first edge conductive part and the second edge conductive part. The main conductive part includes at least one first group of sub-conductive parts and at least one second group of sub-conductive
(Continued)

parts. The first group of sub-conductive parts and the second group of sub-conductive parts are arranged alternately in the first direction.

17 Claims, 5 Drawing Sheets

(51) Int. Cl.
*H10D 86/40* (2025.01)
*H10D 86/60* (2025.01)

(58) Field of Classification Search
CPC ......... G02F 1/134363; G02F 1/134345; G02F 1/13394; G02F 2201/40; G02F 1/134309; G02F 1/13439; G02F 1/134381; G02F 2201/123; H01L 27/124; Y02E 60/10; H10D 86/60; H10D 86/441
See application file for complete search history.

(56) References Cited

U.S. PATENT DOCUMENTS

| | | | |
|---|---|---|---|
| 9,442,333 B2 | 9/2016 | Um et al. | |
| 9,715,855 B2 | 7/2017 | Huang et al. | |
| 9,851,610 B2 | 12/2017 | Chang et al. | |
| 9,858,870 B2 | 1/2018 | Huang et al. | |
| 9,897,865 B2 | 2/2018 | Jiang et al. | |
| 9,995,976 B2 | 6/2018 | Jia et al. | |
| 10,254,597 B2 | 4/2019 | Xu | |
| 10,429,708 B2 | 10/2019 | Liu et al. | |
| 10,768,491 B2 | 9/2020 | Li et al. | |
| 11,099,437 B2 | 8/2021 | Cheng et al. | |
| 2002/0126241 A1* | 9/2002 | Kurahashi | G02F 1/134363 349/114 |
| 2007/0153202 A1 | 7/2007 | Kang | |
| 2009/0128727 A1* | 5/2009 | Yata | G02F 1/134363 349/141 |
| 2009/0185125 A1* | 7/2009 | Hida | G02F 1/134363 349/141 |
| 2010/0201933 A1 | 8/2010 | Sonoda et al. | |
| 2010/0265448 A1 | 10/2010 | Nakanishi et al. | |
| 2014/0160401 A1 | 6/2014 | Yonemura et al. | |
| 2014/0319530 A1 | 10/2014 | Chung et al. | |
| 2015/0009465 A1 | 1/2015 | Park et al. | |
| 2015/0108486 A1* | 4/2015 | Um | G02F 1/1368 257/72 |
| 2015/0109268 A1 | 4/2015 | Huang et al. | |
| 2015/0146117 A1* | 5/2015 | Lee | G02B 30/25 349/15 |
| 2016/0291423 A1 | 10/2016 | Chang et al. | |
| 2017/0108745 A1 | 4/2017 | Jia et al. | |
| 2017/0153480 A1 | 6/2017 | Lv | |
| 2017/0199410 A1 | 7/2017 | Jiang et al. | |
| 2017/0278467 A1 | 9/2017 | Huang et al. | |
| 2018/0149931 A1 | 5/2018 | Xu | |
| 2019/0041710 A1 | 10/2019 | Liu et al. | |
| 2019/0361301 A1* | 11/2019 | Li | G02F 1/1362 |
| 2020/0174300 A1 | 6/2020 | Cheng et al. | |
| 2022/0373843 A1* | 11/2022 | Chen | G02F 1/136286 |
| 2023/0221604 A1* | 7/2023 | Ling | G02F 1/136222 349/33 |

FOREIGN PATENT DOCUMENTS

| | | | | |
|---|---|---|---|---|
| CN | 101814511 A | 8/2010 | | |
| CN | 101968585 A | 2/2011 | | |
| CN | 202141876 U | 2/2012 | | |
| CN | 103488002 A | 1/2014 | | |
| CN | 103885256 A | 6/2014 | | |
| CN | 103941490 A | 7/2014 | | |
| CN | 104133312 A | 11/2014 | | |
| CN | 104181735 A | 12/2014 | | |
| CN | 104199223 A | 12/2014 | | |
| CN | 204422931 U | 6/2015 | | |
| CN | 104820322 A | 8/2015 | | |
| CN | 105158995 A | 12/2015 | | |
| CN | 105159001 A | 12/2015 | | |
| CN | 105572983 A | 5/2016 | | |
| CN | 105629591 A | 6/2016 | | |
| CN | 106353930 A | 1/2017 | | |
| CN | 106444171 A | 2/2017 | | |
| CN | 106526937 A | 3/2017 | | |
| CN | 103885256 B | 4/2017 | | |
| CN | 106773378 A | 5/2017 | | |
| CN | 107255879 A | 10/2017 | | |
| CN | 107272271 A | 10/2017 | | |
| CN | 107589587 A | 1/2018 | | |
| CN | 104181735 B | 4/2018 | | |
| CN | 108828822 A | 11/2018 | | |
| CN | 109188813 A | 1/2019 | | |
| CN | 109298570 A | 2/2019 | | |
| CN | 106444171 B * | 6/2019 | ....... | G02F 1/133514 |
| CN | 110068968 A | 7/2019 | | |
| CN | 110082967 A | 8/2019 | | |
| CN | 110133920 A | 8/2019 | | |
| CN | 106353930 B | 9/2019 | | |
| CN | 110297364 A | 10/2019 | | |
| CN | 110764318 A | 2/2020 | | |
| CN | 109298570 B | 6/2020 | | |
| CN | 111308797 A | 6/2020 | | |
| CN | 111505870 A | 8/2020 | | |
| CN | 211741794 U | 10/2020 | | |
| CN | 113574448 A | 10/2021 | | |
| CN | 214375724 U | 10/2021 | | |
| EP | 3671335 A1 | 6/2020 | | |
| KR | 20070020868 A | 2/2007 | | |
| KR | 20120045493 A | 5/2012 | | |
| KR | 20120107269 A | 10/2012 | | |
| KR | 20150026586 A | 3/2015 | | |
| KR | 20150078170 A | 7/2015 | | |
| KR | 101818452 B1 | 1/2018 | | |
| WO | 2020077818 A1 | 4/2020 | | |
| WO | 2021168683 A1 | 9/2021 | | |
| WO | 2021232986 A1 | 11/2021 | | |
| WO | 2021232986 A9 | 1/2022 | | |

OTHER PUBLICATIONS

Extended European Search Report for EP Patent Application No. 21935493.3 of Jan. 2, 2024.
Non-final Office Action for U.S. Appl. No. 17/764,734 of Sep. 29, 2023.
Partial Supplementary European Search Report for EP Patent Application No. 22739099.4 of Nov. 27, 2023.
Non-Final Office Action for U.S. Appl. No. 17/907,986 of Oct. 11, 2023.
Written Opinion for International Application No. PCT/CN2021/083044 mailed Jan. 6, 2022.
Written Opinion for International Application No. PCT/CN2021/085622 mailed Dec. 7, 2021.
International Search Report and Written Opinion for International Application No. PCT/CN2021/131962 mailed Feb. 25, 2022.
International Search Report and Written Opinion for International Application No. PCT/CN2022/071870 mailed Mar. 22, 2022.

* cited by examiner

PIXEL ELECTRODE, ARRAY SUBSTRATE AND DISPLAY DEVICE

CROSS-REFERENCE TO RELATED APPLICATION

The present application is a 35 U.S.C. § 371 national phase application of International Application No. PCT/CN2021/085622 filed on Apr. 6, 2021, the entire contents of which is incorporated herein by reference in its entirety.

TECHNICAL FIELD

The present disclosure relates to the field of display technology and, in particular, to a pixel electrode, an array substrate, and a display device.

BACKGROUND

With the continuous development of liquid crystal panels, high-resolution products are constantly being developed. For high-resolution pixels such as 8K, the pixel pitch (i.e., Dot pitch) is relatively small, and the storage capacitance (i.e., Cst) is relatively small. Thus, the pixel voltage is more likely to be pulled by the data voltage. This is prone to asymmetric pulling at both sides of the pixel, which makes the grayscale V-type crosstalk (i.e., V-Crosstalk) more serious and affects the display effect.

SUMMARY

A first aspect of the present disclosure provides a pixel electrode, comprising: a first edge conductive part and a second edge conductive part arranged at intervals in a first direction, and a main conductive part at least partially located between the first edge conductive part and the second edge conductive part. The main conductive part is respectively connected with the first edge conductive part and the second edge conductive part. The main conductive part includes at least one first group of sub-conductive parts and at least one second group of sub-conductive parts. The first group of sub-conductive parts and the second group of sub-conductive parts are alternately arranged in the first direction.

Each first group of sub-conductive parts includes a first connection strip. The first connection strip extends in the first direction, and has a first surface and a second surface being opposite in a second direction. Each first group of sub-conductive parts has a first slit located at a side of the first surface away from the second surface. An end of the first slit away from the first connection strip is an open end.

Each second group of sub-conductive parts includes a second connection strip located at a side of the first slit away from the first connection strip and connected to the first group of sub-conductive parts. The second connection strip extends in the first direction, and has a third surface and a fourth surface being opposite in the second direction. The third surface is located at a side of the fourth surface close to the first surface. Each second group of sub-conductive parts has a second slit located at a side of the third surface away from the fourth surface. An end of the second slit away from the second connection strip is an open end.

In the second direction, the pixel electrode is configured such that the first connection strip thereof is closer to the transistor than the second connection strip. An end of the first edge conductive part or the second edge conductive part away from the second connection strip is configured to be connected with the transistor.

A sum of lengths of the first connection strips in the at least one first group of sub-conductive parts is less than a sum of lengths of the second connection strips in the at least one second group of sub-conductive parts.

The first direction intersects with the second direction.

In an exemplary embodiment of the present disclosure, each first group of sub-conductive parts further includes a plurality of first electrode strips arranged at intervals in the first direction. The plurality of first electrode strips is located at a position where the first surface is away from the second surface, and is connected with the first surface. The first slit is provided between two adjacent ones of the first electrode strips.

Each second group of sub-conductive parts further includes a plurality of second electrode strips arranged at intervals in the first direction. The plurality of second electrode strips is located at a position where the third surface is away from the fourth surface, and is connected with the third surface. The second slit is arranged between two adjacent ones of the second electrode strips.

The third surface of the second connection strip is connected to an end away from the first connection strip of the first electrode strip closest to the second group of sub-conductive parts.

In an exemplary embodiment of the present disclosure, the length of the first connection strip is smaller than the length of the second connection strip.

In an exemplary embodiment of the present disclosure, the main conductive part includes one first group of sub-conductive parts and one second group of sub-conductive parts.

The first edge conductive part is located at a side of the plurality of first electrode strips away from the second group of sub-conductive parts, and is located at a position where the first surface of the first connection strip is away from the second surface. The first edge conductive part is connected to the first surface, and a third slit exists between the first edge conductive part and the first electrode strip adjacent thereto. An end of the third slit away from the first connection strip is an open end.

The second edge conductive part is located at a side of the plurality of second electrode strips away from the first group of sub-conductive parts, and is located at a position where the third surface of the second connection strip is away from the fourth surface. The second edge conductive part is connected to the third surface, and a fourth slit exists between the second edge conductive part and the second electrode strip adjacent thereto. An end of the fourth slit away from the second connection strip is an open end.

In an exemplary embodiment of the present disclosure, extension directions of the first electrode strip, the first slit and the third slit are the same, and intersect with the first direction and the second direction; and extension directions of the second electrode strip, the second slit and the fourth slit are the same, and intersect with the first direction and the second direction.

In an exemplary embodiment of the present disclosure, the first electrode strip, the second electrode strip, the first slit, the second slit, the third slit, and the fourth slit have equal width.

In an exemplary embodiment of the present disclosure, extension directions of the first electrode strip and the second electrode strip are the same, and the second slit exists between the first electrode strip and the second electrode strip adjacent thereto.

In an exemplary embodiment of the present disclosure, extension directions of the first electrode strip and the second electrode strip are arranged in a mirror-image way with respect to the second direction.

In an exemplary embodiment of the present disclosure, each second group of sub-conductive parts further includes an adjustment part. The adjustment part is located at a side of the plurality of second electrode strips close to the first group of sub-conductive parts, and is located at a position where the third surface of the second connection strip is away from the fourth surface. The adjustment part is connected with the third surface of the second connection strip.

A fifth slit is formed between the adjustment part and the first electrode strip adjacent thereto, and a sixth slit is formed between the adjustment part and the second electrode strip adjacent thereto.

Ends of the fifth slit and the sixth slit away from the second connection strip are both open ends.

The fifth slit and the first slit extend in the same direction and have the same width, and the sixth slit and the second slit extend in the same direction and have the same width.

In an exemplary embodiment of the present disclosure, the adjustment part includes a first adjustment strip and a second adjustment strip. The fifth slit is formed between the first adjustment strip and the first electrode strip. The sixth slit is formed between the second adjustment strip and the second electrode strip.

The first adjustment strip and the first electrode strip have the same extension direction had the same width, and the second adjustment strip and the second electrode strip have the same extension direction and the same width.

First ends of the first adjustment strip and the second adjustment strip in the extension directions thereof are connected with the third surface of the second connection strip, and second ends of the first adjustment strip and the second adjustment strip in the extension directions thereof are connected with each other.

In an exemplary embodiment of the present disclosure, a ratio of the sum of the lengths of the first connection strips in the at least one first group of sub-conductive parts to the sum of the lengths of the second connection strips in the at least one second group of sub-conductive parts is from 0.1 to 0.9.

A second aspect of the present disclosure provides an array substrate, which includes a first substrate and sub-pixels arranged on the first substrate in an array along a first direction and a second direction. Each sub-pixel includes a transistor and the pixel electrode according to any one of the above embodiments. An end of the first edge conductive part or the second edge conductive part of the pixel electrode away from the second connection strip is connected to the transistor.

In the second direction, the transistor is disposed closer to the first connection strip than the second connection strip of the pixel electrode.

In an exemplary embodiment of the present disclosure, an orthographic projection of the transistor on the first substrate and an orthographic projection of the first connection strip of the pixel electrode on the first substrate are arranged to be opposite in the first direction.

In an exemplary embodiment of the present disclosure, among two adjacent pixel electrodes in the second direction, an end of the first edge conductive part of one pixel electrode away from the second connection strip is connected to the transistor, and is closer to the transistor connected thereto than the second edge conductive part thereof; and an end of the second edge conductive part of the other pixel electrode away from the second connection strip is connected to the transistor, and is closer to the transistor connected thereto than the first edge conductive part thereof.

In an exemplary embodiment of the present disclosure, the array substrate further includes a plurality of data lines formed on the first substrate. The data lines extend in the first direction. The data lines and the sub-pixels are alternately arranged in the second direction.

In the pixel electrode of each sub-pixel, the distance between the first connection strip and the data line closest thereto is the first distance, and the distance between the second connection strip and the data line closest thereto is the second distance. The first distance and the second distance are equal.

In an exemplary embodiment of the present disclosure, each of the data lines is connected to the transistor of each sub-pixel located on the same side thereof in the second direction and adjacent thereto.

The first electrode and the second electrode of the transistor are arranged in the same layer as the data line, and are located at a side of the pixel electrode close to the first substrate. The first electrode of the transistor is connected to the data line. The second electrode of the transistor is connected to the second edge conductive part or the first edge conductive part of the pixel electrode through a transfer via hole.

In an exemplary embodiment of the present disclosure, the first electrode and the second electrode of the transistor are arranged at intervals in the first direction. The distance between the first electrode and the second electrode in the first direction is the third distance.

A ratio of the sum of the lengths of the first connection strips in the at least one first group of sub-conductive parts to the third distance is from 2 to 20.

In an exemplary embodiment of the present disclosure, each sub-pixel further includes a common electrode, which is located at a side of the pixel electrode close to the first substrate and insulated from the pixel electrode.

An orthographic projection of the common electrode on the first substrate overlaps with an orthographic projection of the pixel electrode on the first substrate, but does not overlap with an orthographic projection of the data line on the first substrate.

In an exemplary embodiment of the present disclosure, the array substrate further includes a plurality of scan lines and a plurality of common lines formed on the first substrate and extending in the second direction. The scan lines and the common lines are alternately arranged in the first direction. An orthographic projection of the scan lines on the first substrate does not overlap with an orthographic projection of the common lines on the first substrate.

The scan lines and the common lines are arranged in the same layer, and the scan lines and the common lines are located at a side of the data lines close to the first substrate and insulated from the data lines.

A first side of each sub-pixel in the first direction is adjacent to the common lines, and a second side of each sub-pixel in the first direction is adjacent to the scan lines.

Each of the scan lines is connected to the gate of the transistor of each sub-pixel located on the same side thereof in the first direction and adjacent thereto.

Each of the common lines is connected to the common electrode of each sub-pixel located on the same side thereof in the first direction and adjacent thereto.

In an exemplary embodiment of the present disclosure, a portion of the scan line constitutes a gate of the transistor, and the common electrode is in contact with the common line.

A third aspect of the present disclosure provides a display device, which includes the array substrate described in any one of the above embodiments and a counter substrate arranged in alignment with the array substrate.

Other features and advantages of the present disclosure will become apparent from the following detailed description, or be learned in part by practice of the present disclosure.

It is to be understood that the foregoing general description and the following detailed description are exemplary and explanatory only, and are not restrictive of the present disclosure.

BRIEF DESCRIPTION OF THE DRAWINGS

The accompanying drawings, which are incorporated in and constitute a part of the present specification, illustrate embodiments consistent with the present disclosure and together with the present description serve to explain the principle of the present disclosure. Obviously, the drawings in the following description are only some embodiments of the present disclosure. For those of ordinary skill in the art, other drawings may also be obtained from these drawings without creative efforts.

DETAILED DESCRIPTION OF THE EMBODIMENTS

Figure 1:
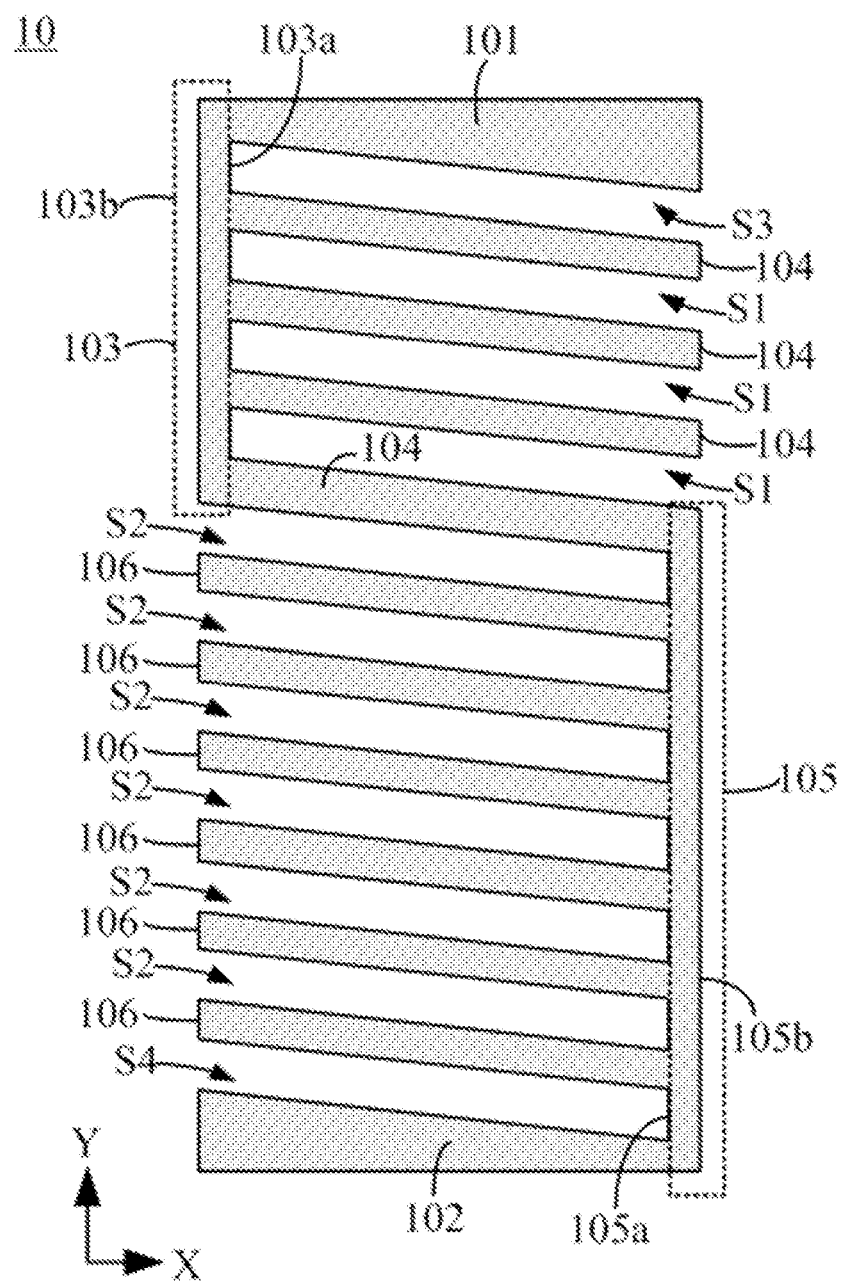
FIG. 1 shows a schematic structural diagram of a pixel electrode according to an embodiment of the present disclosure.

The technical solutions of the present disclosure will be further specifically described below through embodiments and in conjunction with the accompanying drawings. In the specification, the same or similar reference numerals refer to the same or similar parts. The following description of embodiments of the present disclosure with reference to the accompanying drawings is intended to explain the general inventive concept of the present disclosure, and should not be construed as a limitation of the present disclosure.

Furthermore, in the following detailed description, for convenience of explanation, numerous specific details are set forth in order to provide a thorough understanding of embodiments of the present disclosure. Obviously, however, one or more embodiments may be practiced without these specific details.

The terms "a", "an", "the", "said" and "at least one" are used to indicate the presence of one or more elements or components, etc. The terms "include" and "have" are used to indicate an open-ended inclusion, and means that additional elements or components, etc. may be present in addition to the listed elements or components, etc.

It should be noted that, although the terms "first", "second", etc. may be used herein to describe various regions, layers and/or sections, these regions, layers and/or sections should not be limited by these terms. Rather, these terms are used to distinguish one region, layer and/or section from another.

Figure 2:
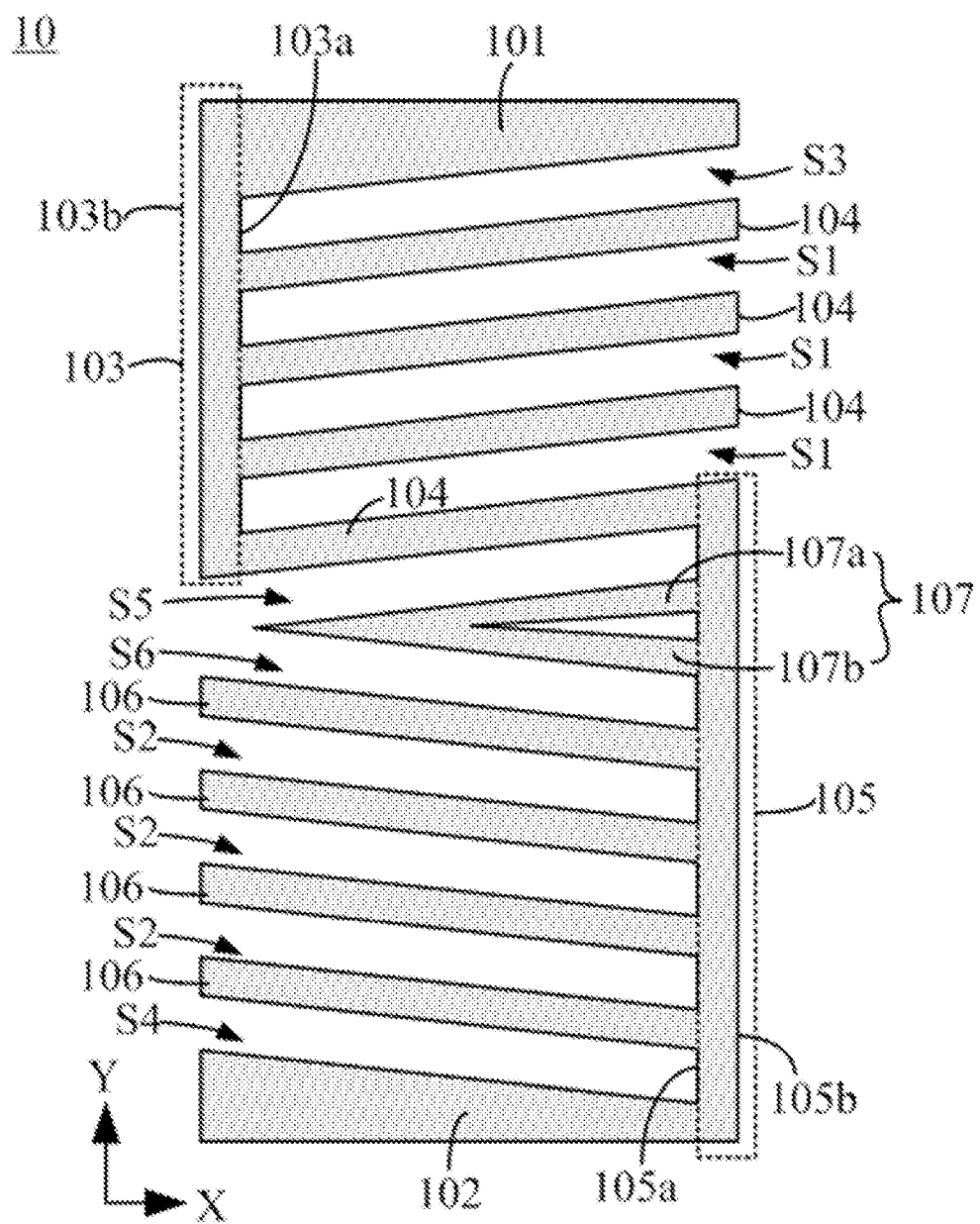
FIG. 2 shows a schematic structural diagram of a pixel electrode according to another embodiment of the present disclosure.

As shown in FIG. 1 and FIG. 2, an embodiment of the present disclosure provides a pixel electrode 10, which may be applied to a liquid crystal display product, but is not limited thereto. Specifically, the pixel electrode 10 may include a first edge conductive part 101 and a second edge conductive part 102 arranged at intervals in the first direction Y, and a main conductive part at least partially located between the first edge conductive part 101 and the second edge conductive part 102. The main conductive part is connected to the first edge conductive part 101 and the second edge conductive part 102 respectively. The main conductive part may include at least one first group of sub-conductive parts and at least one second group of sub-conductive parts. The first group of sub-conductive parts and the second group of sub-conductive parts are alternately arranged in the first direction Y.

As shown in FIG. 1 and FIG. 2, the aforementioned first group of sub-conductive parts may include a first connection strip 103 and a plurality of first electrode strips 104 arranged at intervals in the first direction Y. The first connection strip 103 extends in the first direction Y (that is, the length direction of the first connection strip 103 is the first direction Y). The first connection strip 103 may have a first surface 103a and a second surface 103b opposite to each other in the second direction X. It should be noted that the first direction Y may intersect with the second direction X. For example, the first direction Y and the second direction X may be perpendicular to each other. The plurality of first electrode strips 104 may be located at a position where the first surface 103a is away from the second surface 103b, and may be connected to the first surface 103a. A slit is formed between two adjacent first electrode strips 104, which may be defined as a first slit S1. Ends of the two adjacent first electrode strips 104 away from the first connection strip 103 are disconnected from each other. In other words, an end of the first slit S1 away from the first connection strip 103 is open. For the convenience of description, an end of the first slit S1 away from the first connection strip 103 may be defined as an open end.

As shown in FIG. 1 and FIG. 2, the aforementioned second group of sub-conductive parts includes a second connection strip 105 and a plurality of second electrode strips 106 arranged at intervals in the first direction Y. The second connection strip 105 extends in the first direction Y. That is, the length direction of the second connection strip 105 is the first direction Y. The second connection strip 105 may have a third surface 105a and a fourth surface 105b opposite in the second direction X. In the second direction X, the third surface 105a of the second connection strip 105 may be located at a side of the fourth surface 105b thereof close to the first surface 103a of the first connection strip 103. The third surface 105a of the second connection strip 105 may be connected to the first electrode strip 104 close to the second group of sub-conductive parts. Specifically, it may be connected to an end of the first electrode strip 104 away from the first connection strip 103. It should be understood that the first electrode strip 104 close to the second group of sub-conductive parts as mentioned here refer to the first electrode strip 104 closest to the second group of sub-conductive parts in the first group of sub-conductive parts. The plurality of second electrode strips 106 is located at a position where the third surface 105a of the second connection strip 105 is away from the fourth surface 105b, and is connected to the third surface 105a of the second connection strip 105. A slit is formed between two adjacent second electrode strips 106, which may be defined as a second slit S2. Ends of the two adjacent second electrode strips 106 away from the second connection strip 105 are disconnected from each other. In other words, an end of the second slit S2 away from the second connection strip 105 is open. For the convenience of description, an end of the second slit S2 away from the second connection strip 105 may be defined as an open end.

Figure 4:
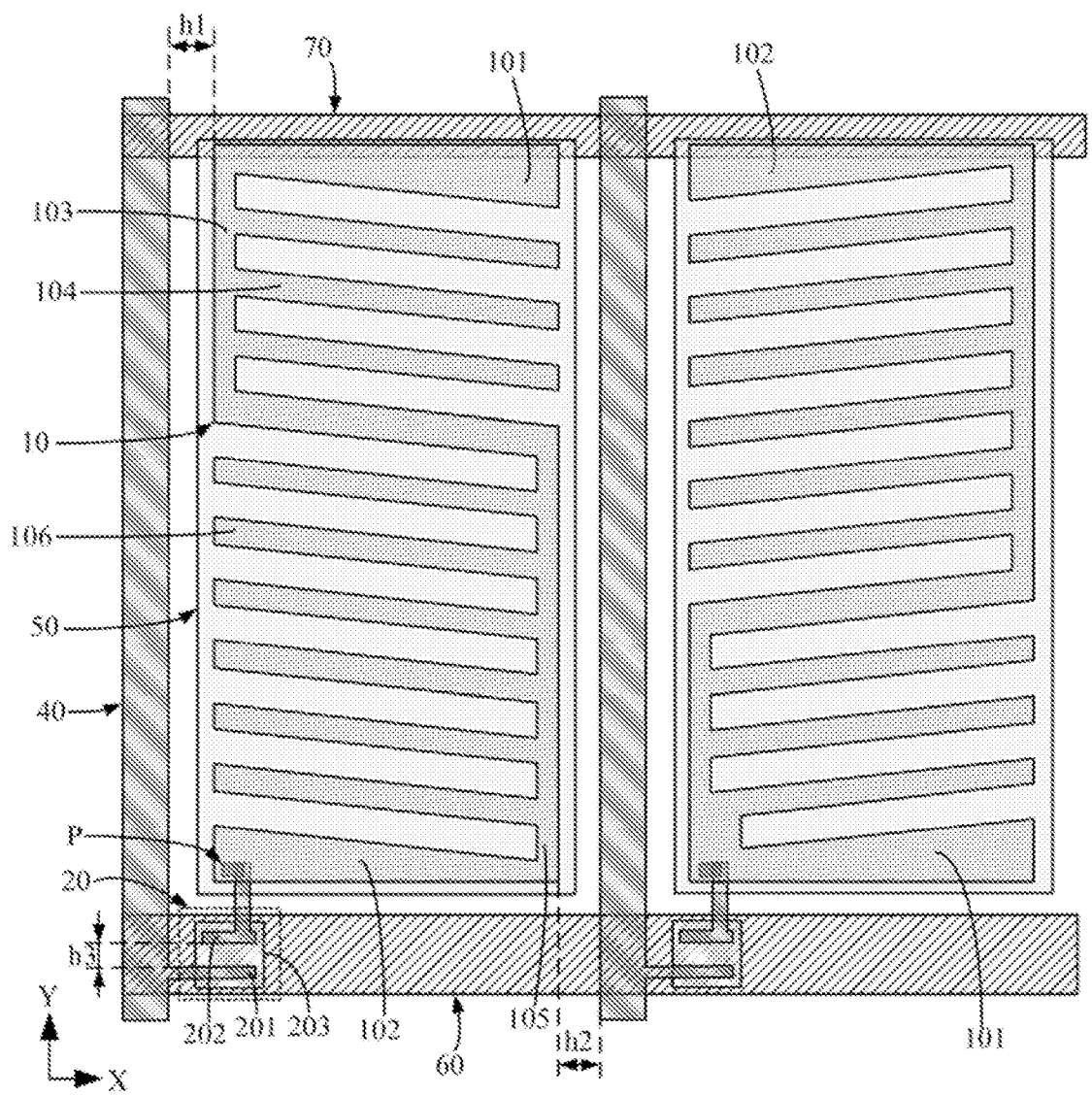
FIG. 4 shows a schematic structural diagram of a minimum repeat unit of an array substrate according to an embodiment of the present disclosure.
Figure 5:
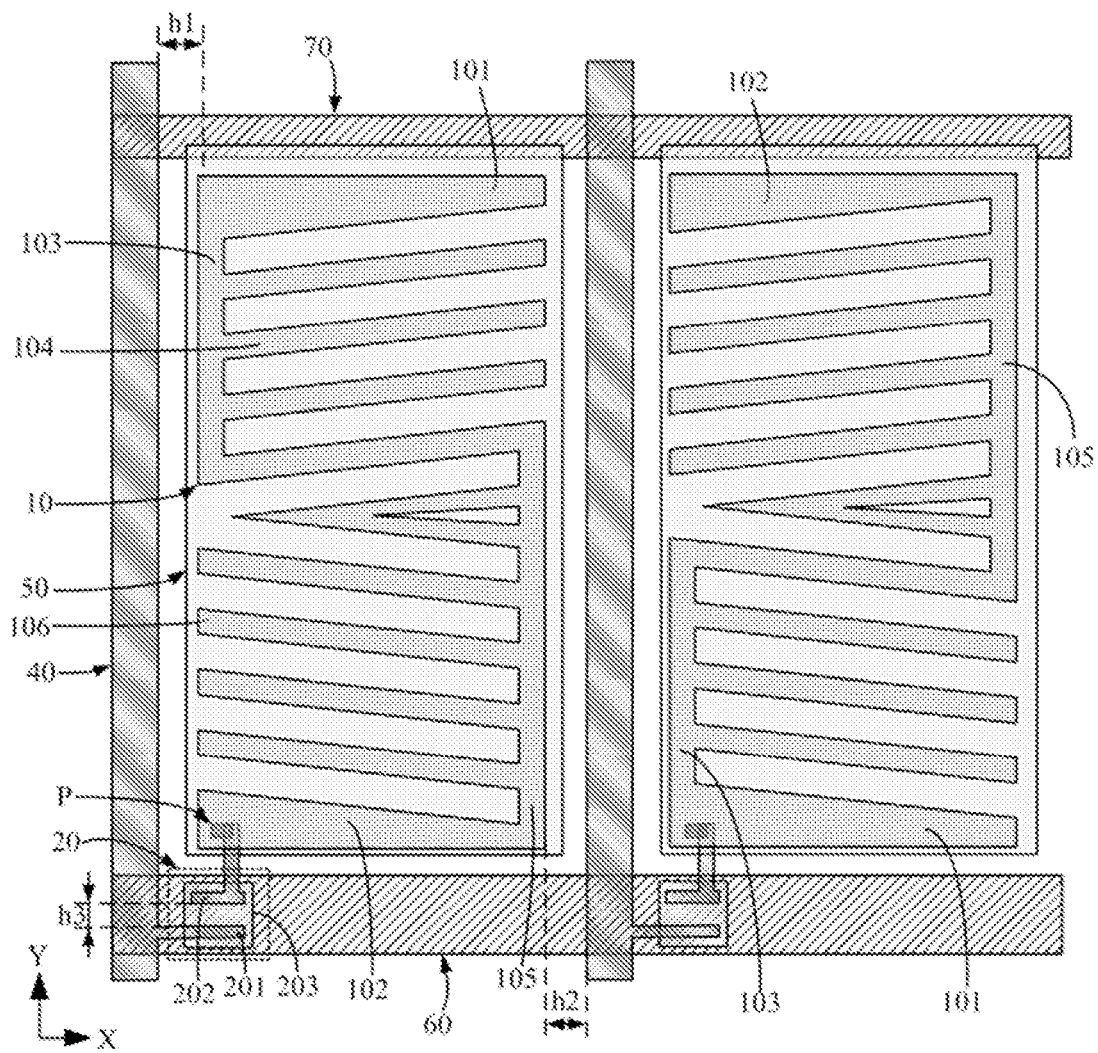
FIG. 5 shows a schematic structural diagram of a minimum repeat unit of an array substrate according to another embodiment of the present disclosure.

In an embodiment of the present disclosure, the pixel electrode 10 may be connected to the transistor 20 (as shown in FIG. 4 and FIG. 5) through the first edge conductive part 101 or the second edge conductive part 102 as aforementioned. An end of the first edge conductive part 101 or the second edge conductive part 102 away from the second connection strip 105 may be configured to be connected to the transistor 20. In the second direction X, the pixel electrode 10 is configured such that the first connection strip 103 thereof is closer to the transistor 20 than the second connection strip 105. It should be understood that the transistor 20 may be connected to the data line 40 adjacent thereto (as shown in FIG. 4 and FIG. 5).

Figure 3:
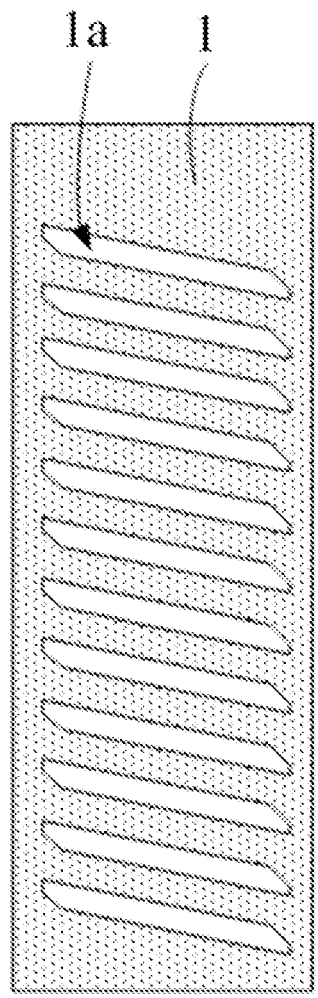
FIG. 3 shows a schematic structural diagram of a pixel electrode described in the related art.

To sum up, in an embodiment of the present disclosure, the peripheries of the first slit S1 and the second slit S2 of the pixel electrode 10 are not completely closed. That is, an end of the first slit S1 close to the second connection strip 105 is an open end, and an end of the second slit S2 close to the first connection strip 103 is an open end. It should be understood that when the pixel electrode 10 according to an embodiment of the present disclosure is applied to a display product, the open end of the first slit S1 and the open ends of the second slit S2 may be adjacent to the data lines 40 at both sides of the pixel electrode 10 (as shown in FIG. 4 and FIG. 5), respectively. As compared with the pixel electrode 1 in the related art shown in FIG. 3, where the periphery of the slit 1a is completely closed, according to the scheme of the present disclosure, when it is applied to a liquid crystal display product, the range of the dark field region of the liquid crystal display product may be effectively reduced, thereby improving the transmittance of the liquid crystal display product.

It should be understood that, as shown in FIG. 4 and FIG. 5, a lateral capacitance exists between the first electrode 201 and the second electrode 202 of the transistor 20, and in the second direction X, the transistor 20 is closer to the first connection strip 103 than the second connection strip 105. When driving the display product, a lateral capacitance generated between the first electrode 201 and the second electrode 202 of the transistor 20 may be formed at the side where the first connection strip 103 of the pixel electrode 10 is located, as compared with the side where the second connection strip 105 thereof is located (as shown in FIGS. 4 and 5, the right side of the pixel electrode). That is, in the pixel electrode 10 shown in FIG. 4 and FIG, the capacitance generated at the left side may include the lateral capacitance generated between the first connection strip 103 and the data line 40, and the lateral capacitance generated between the first electrode 201 and the second electrode 202 of the transistor 20; and the capacitance generated at the right side thereof may include the lateral capacitance generated between the second connection strip 105 and the data line 40. This shows that the left side of the pixel electrode 10 as shown in FIG. 4 and FIG. 5 has a lateral capacitance generated between the first electrode 201 and the second electrode 202 of the transistor 20 as compared with the right side.

The sum of the lengths of the first connection strips 103 of each first group of sub-conductive parts in the pixel electrode 10 may be set to be greater than or equal to the sum of the lengths of each second connection strips 105 of the second group of sub-conductive parts. In other words, the sum of the capacitances generated between each first connection strip 103 and the data line 40 adjacent thereto in the pixel electrode 10 may be greater than or equal to the sum of the capacitances generated between each second connection strip 105 and the data line 40 adjacent thereto. In this case, the side where the first connection strip 103 of the pixel electrode 10 is located has a lateral capacitance generated between the first electrode 201 and the second electrode 202 of the transistor 20, as compared with the side where the second connection strip 105 thereof is located. Therefore, the total capacitance on the side where the first connection strip 103 of the pixel electrode is located will be larger than the total capacitance on the side where the second connection strip 105 thereof is located, so that the two sides of the pixel electrode 10 are pulled differently by the data voltage. This makes the display product appear a phenomenon with more serious grayscale V-Crosstalk. In view of above, for the purpose of improving the grayscale V-Crosstalk phenomenon of the product, in an embodiment of the present disclosure, the sum of the lengths of the first connection strips 103 of each first group of sub-conductive parts in the pixel electrode 10 may be set to be smaller than the sum of the lengths of the second connection strips 105 of each second group of sub-conductive parts. It should be noted that the length mentioned here refers to the length in the extension direction thereof.

Optionally, the ratio of the sum of the lengths of the first connection strips 103 of each first group of sub-conductive parts to the sum of the lengths of the second connection strips 105 of each second group of the sub-conductive parts in the pixel electrode 10 may be from 0.1 to 0.9, such as 0.1, 0.3, 0.5, 0.7, 0.9, etc., but not limited to this. For example, the sum of the lengths of the first connection strips 103 of each first group of sub-conductive parts in the pixel electrode 10 may be in a value range from 30 μm to 90 μm, such as 30 μm, 40 μm, 50 μm, 60 jam, 70 μm, 80 μm, 90 μm, etc., but not limited to this. The value range of the sum of the lengths of the second connection strips 105 of each first group of sub-conductive parts in the pixel electrode 10 may be from 60 μm to 120 μm, such as 60 μm, 70 μm, 80 μm, 90 μm, 100 μm, 110 μm, 110 μm, etc., but not limited thereto.

It should be noted that, in the pixel electrode 10 according to an embodiment of the present disclosure, value ranges of the ratio of the sum of the lengths of the first connection strips 103 of each first group of sub-conductive parts to the sum of the lengths of the second connection strips 105 of each second group of the sub-conductive parts, the sum of the lengths of the first connection strips 103 of each first group of sub-conductive parts in the pixel electrode 10, and the sum of the lengths of the second connection strips 105 of each first group of sub-conductive parts in the pixel electrode 10, are not limited to the numerical ranges mentioned above, which may be determined according to the size of the transistor 20. That is, when designing a product, the size of the transistor 20 in the product may be determined in the first place, so that the lateral capacitance generated between the first electrode 201 and the second electrode 202 of the transistor 20 may be determined first, and then the length of the first connection strip 103 and the length of the second connection strip 105 in the pixel electrode may adjusted. Thus, the total capacitance at the side where the first connection strip 103 of the pixel electrode 10 is located may be equal to or substantially equal to the total capacitance at the side where the second connection strip 105 is located (i.e., not exceeding the error range), thereby improving the grayscale V-Crosstalk phenomenon of the product.

In addition, it should be understood that the number of the first group of sub-conductive parts and the second group of sub-conductive parts in the main conductive part of the pixel electrode 10 in an embodiment of the present disclosure may be the same, for example one, two, etc.; but not limited to this. The numbers of the first group of sub-conductive parts and the second group of sub-conductive parts in the main conductive part of the pixel electrode 10 may also be different. That is, the number of the first group of sub-conductive parts in the main conductive part of the pixel electrode 10 may be greater than or less than the number of the second group of sub-conductive parts, and so on.

When the number of the first group of sub-conductive parts and the number of the second group of sub-conductive parts in the pixel electrode 10 are the same, the sum of the lengths of the first connection strips 103 of each first group of sub-conductive parts in the pixel electrode 10 mentioned above may be set to be smaller than the sum of the lengths of the second connection strips 105 of each second group of sub-conductive parts. This may be understood as follows: the lengths of the first connection strips 103 of the first group of sub-conductive parts in the pixel electrode 10 are smaller than the lengths of the second connection strips 105 of the second group of sub-conductive parts.

As shown in FIGS. 1 and 2, the main conductive part of the pixel electrode in an embodiment of the present disclosure may include one first group of sub-conductive parts and one second group of sub-conductive parts. In this case, the first edge conductive part 101 of the pixel electrode 10 is located at a side of the plurality of first electrode strips 104 away from the second group of sub-conductive parts, and is located at a position where the first surface 103a of the first connection strip 103 is away from the second surface 103b. The first edge conductive part 101 may be connected to the first surface 103a, and a third slit S3 is formed between the first edge conductive part 101 and the first electrode strip 104 adjacent thereto. Ends away from the first connection strip 103 of the first edge conductive part 101 and the first electrode strip 104 being adjacent to each other are disconnected from each other. That is, an end of the third slit S3 away from the first connection strip 103 is open. For the convenience of description, an end of the third slit S3 away from the first connection strip 103 may be defined as an open end. The second edge conductive part 102 is located at a side of the plurality of second electrode strips 106 away from the first group of sub-conductive parts, and is located at a position where the third surface 105a of the second connection strip 105 is away from the fourth surface 105b. The second edge conductive part 102 is connected to the third surface 105a, and a fourth slit S4 is formed between the second edge conductive part 102 and the second electrode strip 106 adjacent thereto. Ends away from the second connection strip 105 of the second edge conductive part 102 and the second electrode strip 106 being adjacent to each other are disconnected from each other. That is, an end of the fourth slit S4 away from the first connection strip 103 is open. For the convenience of description, an end of the fourth slit S4 away from the second connection strip 105 may be defined as an open end.

Optionally, the extension directions of the first electrode strip 104, the first slit S1 and the third slit S3 are the same, so as to ensure the display uniformity at the first group of sub-conductive parts of the pixel electrode 10. Furthermore, the extension directions of the first electrode strip 104, the first slit S1 and the third slit S3 all intersect with the first direction Y and the second direction X as aforementioned, so as to reduce color shift. Similarly, the extension directions of the second electrode strip 106, the second slit S2 and the fourth slit S4 are the same, so as to ensure the display uniformity at the second group of sub-conductive parts of the pixel electrode 10. Besides, the extension directions of the second electrode strip 106, the second slit S2 and the fourth slit S4 all intersect with the first direction Y and the second direction X as aforementioned, so as to reduce color shift.

Further, the widths of the first electrode strip 104, the second electrode strip 106, the first slit S1, the second slit S2, the third slit S3 and the fourth slit S4 are equal, so as to better ensure the display uniformity of the product. It needs to be explained that the width mentioned here is a dimension in a direction perpendicular to the extension direction thereof.

In an optional embodiment of the present disclosure, as shown in FIG. 1, the aforementioned extension directions of the first electrode strip 104 and the second electrode strip 106 may be the same. That is, the first electrode strip 104 and the second electrode strip 106 may extend in the same direction. This means that the pixel electrode 10 in an embodiment of the present disclosure may have a monodomain structure, which helps to reduce the difficulty of design. It should be noted that, in an embodiment, the slit between the first electrode strip 104 and the second electrode strip 106 being adjacent to each other may be the second slit S2 as aforementioned.

In another optional embodiment of the present disclosure, as shown in FIG. 2, the extension direction of the first electrode strip 104 and the extension direction of the second electrode strip 106 may be arranged in a mirror-image way with respect to the second direction X. That is, the pixel electrode 10 in an embodiment of the present disclosure may have a dual-domain structure, which helps to expand the view angle of the product. It should be noted that, in an embodiment of the present disclosure, the included angle between the extension direction of the first electrode strip 104 and the extension direction of the second electrode strip 106 may be an acute angle.

When the pixel electrode 10 has a dual-domain structure, as shown in FIG. 2, the second group of sub-conductive parts of the pixel electrode 10 may further include an adjustment part 107. The adjustment part 107 may be located at a side of the plurality of second electrode strips 106 close to the first group of conductive parts, and is located at a position where the third surface 105a of the second connection strip 105 is away from the fourth surface 105b. The adjustment part 107 may be connected to the third surface 105a of the second connection strip 105.

Specifically, as shown in FIG. 2, a fifth slit S5 is formed between the adjustment part 107 and the first electrode strip 104 adjacent thereto, and a sixth slit S5 is formed between the adjustment part 107 and the second electrode strip 106 adjacent thereto. Ends away from the second connection strip 105 of the adjustment part 107 and the first electrode strip 104 being adjacent to each other are in a disconnected state. Ends away from the second connection strip 105 of the adjustment part 107 and the second electrode strip 106 being adjacent to each other are disconnected from each other. That is, ends of the fifth slit S5 and the sixth slit S6 away from the second connection strip 105 are open. For the convenience of description, ends of the fifth slit S5 and the sixth slit S6 away from the second connection strip 105 may be defined as open ends. The fifth slit S5 may have the same extension direction and width as the aforementioned first slit S1, and the sixth slit S6 and the second slit S2 may extend in the same direction and have the same width. Such scheme helps to ensure that the electric field at the junction of the first group of sub-conductive parts and the second group of sub-conductive parts in the pixel electrode 10 is more alike to the electric field at other positions of the pixel electrode 10, thereby ensuring the display uniformity.

For example, as shown in FIG. 2, the adjustment part 107 may include a first adjustment strip 107a and a second adjustment strip 107b. The aforementioned fifth slit S5 is formed between the first adjustment strip 107a and the first electrode strip 104. The above-mentioned sixth slit S6 is formed between the second adjustment strip 107b and the second electrode strip 106. The first adjustment strip 107a and the first electrode strip 104 may have the same extension direction and the same width. The second adjustment strip 107b and the second electrode strip 106 may have the same extension direction and the same width. This helps to further ensure the uniformity of the electric field, and thus ensure the uniformity of display.

It should be noted that, first ends of the first adjustment strip 107a and the second adjustment strip 107b in the extension directions thereof are connected to the third surface 105a of the second connection strip 105, and second ends of the first adjustment strip 107a and the second adjustment strip 107b in the extension directions thereof may be connected to each other. It should be understood that according to an embodiment of the present disclosure, a slit pattern is formed between the first adjustment strip 107a and the second adjustment strip 107b, which helps to reduce the dark field area.

If the width of the slit pattern formed between the first adjustment strip 107a and the second adjustment strip 107b is relatively large, a spacer (not shown in the figures) may be further formed in the slit pattern to be connected with the third surface 105a of the second connection strip 105. This helps to divide the slit pattern into a slit with the same and equal extension direction as the aforementioned first slit S1, and another slit with the same and equal extension direction as the second slit S2. When the width of the slit pattern formed between the first adjustment strip 107a and the second adjustment strip 107b is small, the spacer may not be provided.

In addition, it should be understood that when the area of the adjustment part 107 in an embodiment of the present disclosure is small, the first adjustment strip 107a, the second adjustment strip 107b and the slit pattern mentioned above may be also not provided. That is, the adjustment part 107 may be a monolithic structure without any slit pattern, as the case may be.

To sum up, the pixel electrode 10 in an embodiment of the present disclosure may have a one-piece structure. For example, the pixel electrode 10 in an embodiment of the present disclosure may be a transparent electrode, and the material thereof may be indium tin oxide (ITO) material, but not limited thereto. It may also be made of transparent materials such as indium zinc oxide (IZO), zinc oxide (ZnO), etc.

The present disclosure also provides an array substrate, which may be used in a liquid crystal display device, but is not limited thereto. With reference to FIGS. 1, 2 and 4 to 6, the array substrate in an embodiment of the present disclosure may further include a first substrate 30, sub-pixels located on the first substrate 30 and arranged in an array along the first direction Y and the second direction X, a plurality of data lines 40 formed on the first substrate 30, and a plurality of scan lines 60 and a plurality of common lines 70 formed on the first substrate 30. It should be noted that the first direction Y as mentioned in an embodiment of the present disclosure may be referred to as a column direction, and the second direction X may be referred to as a row direction.

The array substrate according to an embodiment of the present disclosure will be described in detail below with reference to the accompanying drawings.

Figure 6:
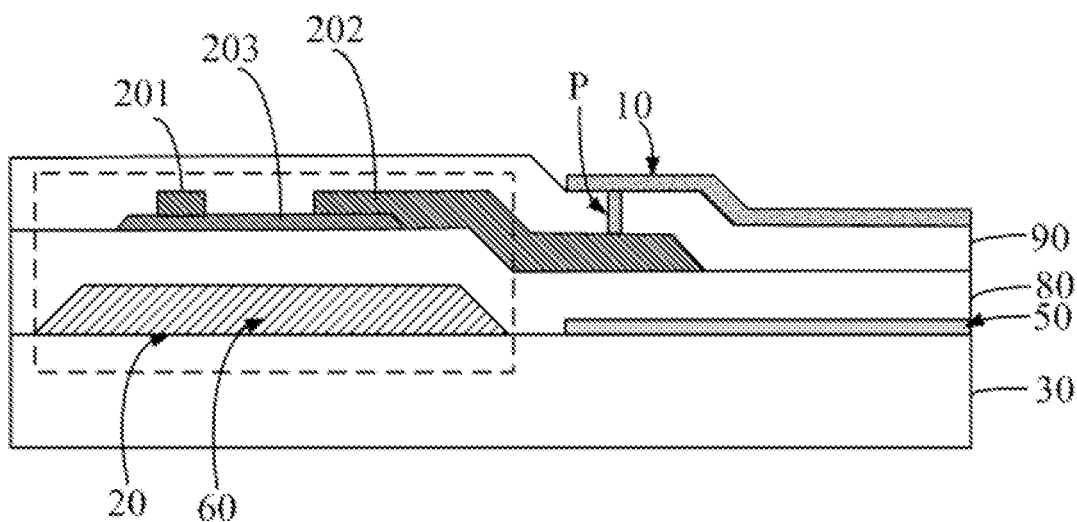
FIG. 6 shows a schematic cross-sectional structure diagram of an array substrate according to an embodiment of the present disclosure.

As shown in FIG. 6, the first substrate 30 may have a single-layer structure, but is not limited thereto. The first substrate 30 may also include a multi-layer structure. For example, the material of the first substrate 30 may be glass, but not limited thereto. The material of the first substrate 30 may also be other materials, such as polyimide (PI), depending on the specific situations.

As shown in FIGS. 4 and 5, the data lines 40 may extend in the first direction Y (i.e., the column direction), and the data lines 40 and the sub-pixels may be alternately arranged in the second direction X (i.e., the row direction). In an embodiment of the present disclosure, each data line 40 is connected to each sub-pixel located on the same side in the second direction X and adjacent thereto. That is, each column of data lines 40 is connected to each sub-pixel adjacent thereto and located in the same column thereof, so as to provide data signals for the sub-pixels in the same column.

For example, the data line 40 may include a metal material or an alloy material, such as a metal single-layer or multi-layer structure formed of molybdenum, aluminum, titanium, etc. For example, the multi-layer structure may be a metal stack formed by multiple metal layers, such as a three-layer metal stack (consisting of Ti/Al/Ti), etc.

As shown in FIG. 4 and FIG. 5, the scan lines 60 and the common lines 70 may extend in the second direction X, and the scan lines 60 and the common lines 70 are alternately arranged in the first direction Y. It should be understood that the orthographic projection of the scan lines 60 on the first substrate 30 does not overlap with the orthographic projection of the common lines 70 on the first substrate 30.

For example, the scan lines 60 and the common lines 70 are arranged in the same layer. In an embodiment of the present disclosure, "being arranged in the same layer" refers to a layer structure formed by using the same film forming process to create a film layer for forming a specific pattern, and then performing one-time patterning process using the same mask. That is, the one-time patterning process corresponds to one mask (also called photomask). Depending on the specific patterns, the one-time patterning process may include multiple exposure, development or etching processes, and the specific patterns in the formed layer structure may be continuous or discontinuous. These specific patterns may also be at different heights or have different thicknesses. Thus, the production process is simplified, the production cost is saved, and the production efficiency is improved.

With reference to FIGS. 4 to 6, the scan lines 60 and the common lines 70 may be located at a side of the data lines 40 close to the first substrate 30 and insulated from the data lines 40. That is to say, a gate insulating layer 80 is provided respectively between the data lines 40 and the scan lines 60 and between the data lines 40 and the common lines 70. It should be understood that the gate insulating layer 80 is provided as a whole layer.

In an embodiment of the present disclosure, as shown in FIG. 4 and FIG. 5, one row of scan lines 60 and one row of common lines 70 being adjacent to each other may be formed in a group, and are set corresponding to one row of sub-pixels. That is, each row of sub-pixels is adjacent to a row of common lines 70 at a side in the first direction Y, and is adjacent to a row of scan lines 60 at the other side in the first direction Y. Each scan line 60 is connected to each sub-pixel located on the same side in the first direction Y and adjacent thereto. In other words, each row of scan lines 60 may be connected to the sub-pixels adjacent thereto and located in the same row, so as to provide scan signals for the same row of sub-pixels. Each common line 70 is connected to each sub-pixel located at the same side in the first direction Y and adjacent thereto. That is, each row of common lines 70 may be connected to the sub-pixels adjacent thereto and located in the same row, so as to provide common signals for the sub-pixels in the same row.

For example, the scan lines 60 and the common lines 70 may include metal materials or alloy materials, such as metal single-layer or multi-layer structures formed of molybdenum, aluminum, and titanium.

In an embodiment of the present disclosure, as shown in FIG. 4 and FIG. 5, each sub-pixel may include a pixel electrode 10, a transistor 20 and a common electrode 50.

For the structure of the pixel electrode 10, the content described in any of the foregoing embodiments may be referred to, and the specific structure as shown in FIG. 1 and FIG. 2 may be referred to, which will not be repeated here.

As shown in FIG. 4 and FIG. 5, in the pixel electrode 10 of the sub-pixel, the distance between the first connection strip 103 and the data line 40 closest thereto is the first distance h1, and the distance between the second connection strip 105 and the data line 40 closest thereto is the second distance h2. The first distance h1 may be equal to the second distance h2. This facilitates the subsequent configuration of the size of the first connection strip 103 and the size of the second connection strip 105, and reduces the difficulty of manufacturing. But it should be understood that the first distance h1 may also be different from the second distance h2, depending on the specific situations.

With reference to FIGS. 4 to 6, the transistor 20 may include an active layer 203, a gate, and a first electrode 201 and a second electrode 202 disposed in the same layer. For example, the first electrode 201 and the second electrode 202 may be arranged on the same layer as the aforementioned data lines 40. A gate insulation layer 80 may be further provided between the gate of the transistor 20 and the active layer 203, so as to insulate the gate from the active layer 203. The gate insulation layer 80 may be made of inorganic materials, such as, silicon oxide, silicon nitride and other inorganic materials.

It should be noted that the gate may be disposed in the same layer as the aforementioned scan lines 60, and the gate may be a part of the aforementioned scan lines 60. That is, a portion of the scan lines 60 may be used as the gate of the transistor 20 to realize the connection between the scan lines 60 and the transistor The first electrode 201 and the second electrode 202 may be respectively connected to the two doped regions of the active layer 203 (i.e., the source doped region and the drain doped region). The first electrode 201 may also be connected to the data lines 40 to realize the connection between the data lines 40 and the transistor 20. The second electrode 202 may be connected to the pixel electrode Specifically, an end of the first edge conductive part 101 or the second edge conductive part 102 of the pixel electrode 10 away from the second connection strip 105 may be connected to the second electrode 202 of the transistor 20, so as to realize the connection between the transistor 20 and the pixel electrode 10.

As shown in FIG. 4 and FIG. 5, in the second direction X, the transistor 20 of each sub-pixel is disposed closer to the first connection strip 103 than the second connection strip 105 of the pixel electrode 10 thereof. This helps to make the total capacitance on the side where the first connection strip 103 of the pixel electrode 10 is located to be equal to or substantially equal to the total capacitance on the side where the second connection strip 105 is located, thereby improving the grayscale V-Crosstalk phenomenon of the product.

Further, the orthographic projection of the transistor 20 on the first substrate 30 is disposed opposite in the first direction Y to the orthographic projection of the first connection strip 103 of the pixel electrode 10 on the first substrate 30.

Optionally, as shown in FIG. 4 and FIG. 5, two adjacent sub-pixels in the second direction X are taken as the minimum repeat unit. Among the two adjacent pixel electrodes 10 in the second direction X, an end of the first edge conductive part 101 of one pixel electrode 10 away from the second connection strip 105 is connected to the transistor 20 and is closer to the transistor 20 connected thereto than the second edge conductive part 102 thereof; and an end of the second edge conductive part 102 of the other pixel electrode 10 away from the second connection strip 105 is connected to the transistor 20 and is closer to the transistor connected thereto than the first edge conductive parts 101 thereof. In other words, as shown in FIG. 5, the second connection strip 105 of one pixel electrode and the first connection strip 103 of the other pixel electrode 10 are both adjacent to the data line 40 located therebetween, and the first connection strip 103 of one pixel electrode 10 and the second connection strip 105 of the other pixel electrode 10 are both far away from the data line 40 located therebetween. In short, one pixel electrode 10 of the two adjacent pixel electrodes 10 in the second direction X may be obtained by vertically flipping the other pixel electrode 10 (i.e., in a mirror-image way with respect to the second direction X). This helps to reduce and balance the dark field area, and at the same time, enlarge the view angle of the product, but not limited to this. The connection relationship between the two adjacent pixel electrodes 10 and the transistor 20 in the second direction X may also be the same, depending on the specific situations.

It should be noted that, among the two adjacent pixel electrodes 10 in the second direction X, the first edge conductive part 101 or the second edge conductive part 102 of one pixel electrode 10 may be the same in structure as the first edge conductive part 101 or the second edge conductive part 102 of the other pixel electrode 10, but it is not limited to this. This may also be slightly adjusted according to the actual situations, as long as the total capacitance on the side where the first connection strip 103 of the pixel electrode 10 is located and the total capacitance on the side where the second connection strip 105 is located are ensured to be equal or substantially equal, so as to improve the grayscale V-Crosstalk phenomenon of the product.

For example, the transistor 20 in an embodiment of the present disclosure may be a bottom-gate type. That is, a gate may be formed on the first substrate 30 first, and the gate may include a metal material or an alloy material, such as molybdenum, aluminum, and titanium, etc., to ensure the good electrical conductivity thereof. Then, a gate insulation layer 80 is formed on the first substrate 30, as shown in FIG.

6, and the gate insulation layer 80 may cover the gate. After that, the active layer 203 is formed on a side of the gate insulation layer 80 away from the first substrate 30. That is, the active layer 203 is located at a side of the gate away from the first substrate 30. Orthographic projections of the active layer 203 and the gate on the first substrate 30 overlap with each other. For example, the orthographic projection of the active layer 203 on the first substrate 30 may be located within the orthographic projection of the gate on the first substrate. The first electrode 201 and the second electrode 202 may be formed after the active layer 203 is formed. A portion of the first electrode 201 may be located on a side of the active layer 203 away from the first substrate 30, and is in contact with the source doped region of the active layer 203. A portion of the second electrode 202 may be located at a side of the active layer 203 away from the first substrate 30, and is in contact with the drain doped region of the active layer 203.

It should be noted that the contact mentioned in embodiments of the present disclosure refers to the fact that the two components are directly attached together without other film layers. That is, there is no need to connect the two components through other structures (for example, a transfer via hole). In addition, it should also be noted that the transistor in embodiments of the present disclosure is not limited to the bottom-gate type mentioned above, and it may also be a top-gate type.

In an embodiment of the present disclosure, as shown in FIG. 4 and FIG. 5, the first electrode 201 and the second electrode 202 of the transistor 20 may be arranged at intervals in the first direction Y, and the distance in the first direction Y between the first electrode 201 and the second electrode 202 may be the third distance h3. The length design of the first connection strip 103 and the second connection strip 105 in the pixel electrode 10 mentioned above is related to the size selection of the transistor 20. Specifically, the ratio of the sum of the lengths of the first connection strips 103 of each first group of sub-conductive parts in the electrode 10 to the third distance h3 may be from 2 to 20, for example 2, 5, 8, 11, 14, 17, 20, etc. For example, the third distance h3 may be 2 μm, 3 μm, 4 μm, 5 μm, 6 μm, etc., but not limited thereto, and it may also be other values.

It should be noted that the sum of the lengths of the first connection strips 103 of each first group of sub-conductive parts in the pixel electrode 10 is not only related to the aforementioned third distance S3, but also related to the thickness and the length of the first electrode 201 and the second electrode 202. The thickness, length of the first electrode 201 and the second electrode 202 and the third distance h3 are the key factors to determine the lateral capacitance generated between the first electrode 201 and the second electrode 202 in the transistor 20. That is, the length design of the first connection strip 103 and the second connection strip 105 in the pixel electrode 10 mainly depends on the lateral capacitance generated between the first electrode 201 and the second electrode 202 in the transistor 20.

For example, the thickness of the first electrode 201 and the second electrode 202 in the transistor 20 may be from 3000 Å to 8000 Å, such as 3000 Å, 4000 Å, 5000 Å, 6000 Å, 7000 Å, 8000 Å, etc., but not limited to this, and other thicknesses may also be used. Besides, the length of the first electrode 201 and the second electrode 202 in the transistor 20 may be from 5 μm to 50 μm, such as 5 jam, 15 μm, 25 μm, 35 μm, 45 μm, 50 μm, etc., but not limited to this, and other values may also be used.

It should be understood that the first electrode 201 and the second electrode 202 of the transistor 20 are not limited to be arranged at intervals in the first direction Y, but may also be arranged at intervals in the second direction X. It should be noted that, when the first electrode 201 and the second electrode 202 of the transistor are arranged at intervals in the second direction X, the aforementioned third distance h3 may be understood as the distance between the first electrode 201 and the second electrode 202 in the second direction X.

In addition, it should be noted that the length of the first electrode 201 and the second electrode 202 in the transistor 20 refers to the dimension in the direction perpendicular to the arrangement direction of the first electrode 201 and the second electrode 202.

In an embodiment of the present disclosure, as shown in FIG. 6, the first electrode 201 and the second electrode 202 of the transistor 20 may be located on the side of the pixel electrode 10 close to the first substrate 30. That is, when the array substrate is fabricated, the first electrode 201 and the second electrode 202 of the transistor 20 may be fabricated first, and then the pixel electrode 10 may be fabricated.

As shown in FIG. 6, a passivation layer 90 may be further provided between the first electrode 201 and the second electrode 202 of the transistor 20 and the pixel electrode 10. The passivation layer 90 may be an inorganic film layer such as silicon nitride. However, the present disclosure is not limited to this, and it may also be an organic film layer. It should be noted that, at this time, the first edge conductive part 101 or the second edge conductive part 102 of the pixel electrode 10 as aforementioned may be connected to the second electrode 202 of the transistor 20 through a transfer via hole P.

In an embodiment of the present disclosure, as shown in FIG. 6, the common electrode 50 may be located on the side of the pixel electrode 10 close to the first substrate 30, and be insulated from the pixel electrode 10. For example, the common electrode 50 may be specifically formed on the first substrate 30 before the active layer 203 is fabricated. That is, the gate insulation layer 80 and the passivation layer 90 may be stacked between the common electrode 50 and the pixel electrode 10 to provide insulation therebetween.

As shown in FIGS. 4 and 6, the orthographic projection of the common electrode 50 on the first substrate 30 may overlap with the orthographic projection of the common line 70 on the first substrate 30. The common electrode 50 may be in contact with the aforementioned common line 70. Specifically, the common electrode 50 may be formed on the first substrate 30 prior to the common line 70. But the present disclosure is not limited thereto, and the common electrode 50 may also be formed on the first substrate 30 after the common line 70 is formed on the first substrate 30.

It should be understood that the orthographic projection of the common electrode 50 on the first substrate 30 overlaps with the orthographic projection of the pixel electrode 10 on the first substrate 30, but does not overlap with the orthographic projection of the data line 40 on the first substrate 30.

For example, the material of the common electrode 50 may be the same as the material of the pixel electrode 10. The common electrode 50 may be a transparent electrode, and the material of the common electrode 50 may be Indium Tin Oxide (ITO) material, but not limited to this. Indium zinc oxide (IZO), zinc oxide (ZnO), and other transparent materials may also be used.

In an embodiment of the present disclosure, the common electrode 50 may be a plate-shaped electrode. That is, the common electrode 50 is not provided with a slit. But the present disclosure is not limited thereto, and a slit may also be provided, depending on the specific situations.

An embodiment of the present disclosure also provides a display device, which may be a liquid crystal display device, but is not limited thereto. Moreover, the display device in an embodiment of the present disclosure may include the array substrate described in any of the foregoing embodiments, which will not be repeated here.

In addition, the display device may further include a counter substrate (not shown in the figures) arranged in alignment with the array substrate, and a liquid crystal layer (not shown in the figures) located between the array substrate and the counter substrate. The liquid crystal molecules in the liquid crystal layer may be negative liquid crystals to improve transmittance. But the present disclosure is not limited thereto, and the liquid crystal molecules may also be positive liquid crystals.

In an embodiment of the present disclosure, the display device may further include a spacer, and the spacer may be integrated on the counter substrate. But the present disclosure is not limited thereto, and the spacer may also be integrated on the array substrate, depending on the specific situations.

The counter substrate in an embodiment of the present disclosure may include a second substrate (not shown in the figures) and a black matrix layer (not shown in the figures) located at a side of the second substrate close to the array substrate. The black matrix layer may have a blocking area and a light-transmissive area. The orthographic projection of the blocking area on the first substrate 30 may completely cover the aforementioned data lines 40, scan lines 60, common lines 70, transistors 20 of the sub-pixels, and spacer, etc. The blocking area may also cover the edges of the common electrode 50 and the pixel electrode 10. The orthographic projection of the light-transmissive area on the first substrate 30 may be located within the orthographic projection of the common electrode 50 and the pixel electrode 10 on the first substrate 30.

In addition, the counter substrate in an embodiment of the present disclosure may further include a color filter layer. The color filter layer may include a red filter block, a green filter block, a blue filter block, and the like.

It should be noted that, the color filter layer is not limited to be integrated in the counter substrate, but may also be integrated in the array substrate, depending on the specific situations.

According to embodiments of the present disclosure, the specific type of the display device is not particularly limited, and any types of display device commonly used in the art may be used, such as a TV, a car display, etc. Those skilled in the art may make corresponding selections according to the specific use of the display device, which will not be repeated here.

It should be noted that in addition to the aforementioned array substrate, counter substrate and liquid crystal layer, the display device further includes other necessary components and parts. Taking the display as an example, it may also include a backlight module, a housing, a main circuit board, a power cord, etc. Those skilled in the art may make corresponding supplements according to the specific usage requirements of the display device, which will not be repeated here.

Other embodiments of the present disclosure will readily occur to those skilled in the art upon consideration of the instant specification and practice of what is disclosed herein. The present disclosure is intended to cover any variations, uses, or adaptations of the present disclosure that follow the general principle of the present disclosure, and includes the common general knowledge or techniques in the technical field not disclosed by the present disclosure. The instant specification and examples are to be regarded as exemplary only, with the true scope and spirit of the present disclosure being indicated by the appended claims.

The invention claimed is:

1. A pixel electrode, comprising:
a first edge conductive part and a second edge conductive part arranged at intervals in a first direction (Y); and
a main conductive part at least partially located between the first edge conductive part and the second edge conductive part, wherein:
the main conductive part is connected to the first edge conductive part and the second edge conductive part respectively, and the main conductive part comprises at least one first group of sub-conductive parts and at least one second group of sub-conductive parts, the first group of sub-conductive parts and the second group of sub-conductive parts being alternately arranged in the first direction (Y);
each first group of sub-conductive parts comprises a first connection strip, the first connection strip extends in the first direction (Y) and has a first surface and a second surface-being opposite in a second direction (X), each first group of sub-conductive parts has a first slit located at a side of the first surface away from the second surface, and an end of the first slit away from the first connection strip is an open end;
each second group of sub-conductive parts comprises a second connection strip located at a side of the first slit away from the first connection strip and connected to the first group of sub-conductive parts, the second connection strip extends in the first direction (Y) and has a third surface and a fourth surface being opposite in the second direction (X), the third surface is located at a side of the fourth surface close to the first surface, each second group of sub-conductive parts comprises a second slit located at a side of the third surface away from the fourth surface, and an end of the second slit away from the second connection strip is an open end;
in the second direction (X), the pixel electrode is configured such that the first connection strip is closer to a transistor than the second connection strip, and an end of the first edge conductive part or the second edge conductive part away from the second connection strip is configured to be connected to the transistor;
a sum of lengths of the first connection strips in the at least one first group of sub-conductive parts is less than a sum of lengths of the second connection strips in the at least one second group of sub-conductive parts;
the first direction (Y) intersects with the second direction (X);
each first group of sub-conductive parts further comprises a plurality of first electrode strips arranged at intervals in the first direction (Y), the plurality of first electrode strips is located at a position where the first surface is away from the second surface, and is connected to the first surface, and the first slit exists between two adjacent ones of the first electrode strips;
each second group of sub-conductive parts further comprises a plurality of second electrode strips arranged at intervals in the first direction (Y), the plurality of second electrode strips is located at a position where the third surface is away from the fourth surface, and is connected to the third surface, and the second slit exists between two adjacent ones of the second electrode strips;

the third surface of the second connection strip is connected to an end away from the first connection strip of the first electrode strip closest to the second group of sub-conductive parts;

extension directions of the first electrode strip and the second electrode strip are arranged in a mirror-image way with respect to the second direction (X);

the second group of sub-conductive parts further comprises an adjustment part, the adjustment part is located at a side of the plurality of second electrode strips close to the first group of sub-conductive parts, and is located at a position where the third surface of the second connection strip is away from the fourth surface, and the adjustment part is connected with the third surface of the second connection strip;

a fifth slit is formed between the adjustment part and the first electrode strip adjacent thereto, and a sixth slit is formed between the adjustment part and the second electrode strip adjacent thereto;

ends of the fifth slit and the sixth slit away from the second connection strip are both open ends; and the fifth slit and the first slit extend in the same direction and have the same width, and the sixth slit and the second slit extend in the same direction and have the same width, wherein the first electrode strip closest to the fifth slit is connected to an end of the second connection strip closest to the first group of sub-conductive parts;

wherein the adjustment part comprises a first adjustment strip and a second adjustment strip, the fifth slit is formed between the first adjustment strip and the first electrode strip, and the sixth slit is formed between the second adjustment strip and the second electrode strip; and wherein second ends, away from the second connection strip, of the first adjustment strip and the second adjustment strip are connected directly to each other to form a junction part, the junction part is spaced by a first distance from the first connection strip and by a second distance from the second connection strip, and the first distance is not zero and is smaller than the second distance so that a dark field area of the pixel electrode is reduced.

2. The pixel electrode according to claim 1, wherein a length of the first connection strip is smaller than a length of the second connection strip.

3. The pixel electrode according to claim 2, wherein:
the main conductive part comprises one first group of sub-conductive parts and one second group of sub-conductive parts;

the first edge conductive part is located at a side of the plurality of first electrode strips away from the second group of sub-conductive parts, and is located at a position where the first surface of the first connection strip is away from the second surface, the first edge conductive part is connected to the first surface, a third slit exists between the first edge conductive part and the first electrode strip adjacent thereto, and an end of the third slit away from the first connection strip is an open end; and the second edge conductive part is located at a side of the plurality of second electrode strips away from the first group of sub-conductive parts, and is located at a position where the third surface of the second connection strip is away from the fourth surface, the second edge conductive part is connected to the third surface, a fourth slit exists between the second edge conductive part and the second electrode strip adjacent thereto, and an end of the fourth slit away from the second connection strip is an open end.

4. The pixel electrode according to claim 3, wherein:
extension directions of the first electrode strip, the first slit and the third slit are the same, and intersect with the first direction (Y) and the second direction (X), and extension directions of the second electrode strip, the second slit and the fourth slit are the same, and intersect with the first direction (Y) and the second direction (X).

5. The pixel electrode according to claim 4, wherein widths of the first electrode strip, the second electrode strip, the first slit, the second slit, the third slit, and the fourth slit are equal.

6. The pixel electrode according to claim 5, wherein the first electrode strip and the second electrode strip extend in the same direction, and the second slit exists between the first electrode strip and the second electrode strip adjacent thereto.

7. The pixel electrode according to claim 1, wherein:
the first adjustment strip and the first electrode strip have the same extension direction and the same width, and the second adjustment strip and the second electrode strip have the same extension direction and the same width; and first ends of the first adjustment strip and the second adjustment strip in the extension directions thereof are connected to the third surface of the second connection strip.

8. The pixel electrode according to claim 1, wherein a ratio of the sum of the lengths of the first connection strips in the at least one first group of sub-conductive parts to the sum of the lengths of the second connection strips in the at least one second group of sub-conductive parts is from 0.1 to 0.9.

9. An array substrate, comprising:
a first substrate, and
sub-pixels, arranged on the first substrate in an array along a first direction (Y) and a second direction (X), wherein:
each sub-pixel comprises a transistor and a pixel electrode, an end of the first edge conductive part or the second edge conductive part of the pixel electrode away from the second connection strip being connected to the transistor; and in the second direction (X), the transistor is arranged closer to the first connection strip than the second connection strip of the pixel electrode, wherein the pixel electrode comprises: a first edge conductive part and a second edge conductive part arranged at intervals in a first direction (Y); and a main conductive part at least partially located between the first edge conductive part and the second edge conductive part;

the main conductive part is connected to the first edge conductive part and the second edge conductive part respectively, and the main conductive part comprises at least one first group of sub-conductive parts and at least one second group of sub-conductive parts, the first group of sub-conductive parts and the second group of sub-conductive parts being alternately arranged in the first direction (Y);

each first group of sub-conductive parts comprises a first connection strip, the first connection strip extends in the first direction (Y) and has a first surface and a second surface being opposite in a second direction (X), each first group of sub-conductive parts has a first slit located at a side of the first surface away from the second surface, and an end of the first slit away from the first connection strip is an open end;

each second group of sub-conductive parts comprises a second connection strip located at a side of the first slit away from the first connection strip and connected to the first group of sub-conductive parts, the second connection strip extends in the first direction (Y) and has a third surface and a fourth surface being opposite in the second direction (X), the third surface is located at a side of the fourth surface close to the first surface, each second group of sub-conductive parts comprises a second slit located at a side of the third surface away from the fourth surface, and an end of the second slit away from the second connection strip is an open end;

in the second direction (X), the pixel electrode is configured such that the first connection strip is closer to a transistor than the second connection strip, and an end of the first edge conductive part or the second edge conductive part away from the second connection strip is configured to be connected to the transistor;

a sum of lengths of the first connection strips in the at least one first group of sub-conductive parts is less than a sum of lengths of the second connection strips in the at least one second group of sub-conductive parts;

the first direction (Y) intersects with the second direction (X);

each first group of sub-conductive parts further comprises a plurality of first electrode strips arranged at intervals in the first direction (Y), the plurality of first electrode strips is located at a position where the first surface is away from the second surface, and is connected to the first surface, and the first slit exists between two adjacent ones of the first electrode strips;

each second group of sub-conductive parts further comprises a plurality of second electrode strips arranged at intervals in the first direction (Y), the plurality of second electrode strips is located at a position where the third surface is away from the fourth surface, and is connected to the third surface, and the second slit exists between two adjacent ones of the second electrode strips;

the third surface of the second connection strip is connected to an end away from the first connection strip of the first electrode strip closest to the second group of sub-conductive parts;

extension directions of the first electrode strip and the second electrode strip are arranged in a mirror-image way with respect to the second direction (X);

the second group of sub-conductive parts further comprises an adjustment part, the adjustment part is located at a side of the plurality of second electrode strips close to the first group of sub-conductive parts, and is located at a position where the third surface of the second connection strip is away from the fourth surface, and the adjustment part is connected with the third surface of the second connection strip;

a fifth slit is formed between the adjustment part and the first electrode strip adjacent thereto, and a sixth slit is formed between the adjustment part and the second electrode strip adjacent thereto;

ends of the fifth slit and the sixth slit away from the second connection strip are both open ends; and the fifth slit and the first slit extend in the same direction and have the same width, and the sixth slit and the second slit extend in the same direction and have the same width, wherein the first electrode strip closest to the fifth slit is connected to an end of the second connection strip closest to the first group of sub-conductive parts;

wherein the adjustment part comprises a first adjustment strip and a second adjustment strip, the fifth slit is formed between the first adjustment strip and the first electrode strip, and the sixth slit is formed between the second adjustment strip and the second electrode strip; and wherein second ends, away from the second connection strip, of the first adjustment strip and the second adjustment strip are connected directly to each other to form a junction part, the junction part is spaced by a first distance from the first connection strip and by a second distance from the second connection strip, and the first distance is not zero and is smaller than the second distance so that a dark field area of the pixel electrode is reduced.

10. The array substrate according to claim 9, wherein an orthographic projection of the transistor on the first substrate is arranged oppositely in the first direction (Y) to an orthographic projection of the first connection strip of the pixel electrode on the first substrate.

11. The array substrate according to claim 10, wherein, among two adjacent ones of the pixel electrodes in the second direction (X), an end of the first edge conductive part of one pixel electrode away from the second connection strip is connected to the transistor, and is closer to the transistor connected thereto as compared with the second edge conductive part thereof; and an end of the second edge conductive part of the other pixel electrode away from the second connection strip is connected to the transistor, and is closer to the transistor connected thereto as compared with the first edge conductive part thereof.

12. The array substrate according to claim 11, further comprising a plurality of data lines formed on the first substrate, the data lines being extending in the first direction (Y), and the data lines and the sub-pixels being alternately arranged in the second direction (X), wherein, in the pixel electrode of each sub-pixel, a distance between the first connection strip and the data line closest thereto is a first distance, and a distance between the second connection strip and the data line closest thereto is a second distance, the first distance being equal to the second distance.

13. The array substrate according to claim 12, wherein each data line is connected to the transistor of each sub-pixel located at the same side thereof in the second direction (X) and adjacent thereto; and a first electrode and a second electrode of the transistor are arranged in the same layer as the data line, and are located at a side of the pixel electrode close to the first substrate; and the first electrode of the transistor is connected to the data line, and the second electrode of the transistor is connected to the second edge conductive part or the first edge conductive part of the pixel electrode through a transfer via hole.

14. The array substrate according to claim 13, wherein:
the first electrode and the second electrode of the transistor are arranged at intervals in the first direction (Y), and a distance between the first electrode and the second electrode in the first direction (Y) is a third distance; and a ratio of the sum of the lengths of the first connection strips in the at least one first group of sub-conductive parts to the third distance is from 2 to 20.

15. The array substrate of claim 13, wherein each sub-pixel further comprises a common electrode, located at a side of the pixel electrode close to the first substrate and insulated from the pixel electrode; and an orthographic projection of the common electrode on the first substrate overlaps with an orthographic projection of the pixel electrode on the first substrate, but does not overlap with an orthographic projection of the data line on the first substrate.

16. The array substrate of claim 15, wherein:

the array substrate further comprises a plurality of scan lines and a plurality of common lines formed on the first substrate and extending in the second direction (X), the scan lines and the common lines being alternately arranged in the first direction (Y), and no overlap existing between an orthographic projection of the scan lines on the first substrate and an orthographic projection of the common lines on the first substrate;

the scan lines and the common lines are arranged in the same layer, and the scan lines and the common lines are located at a side of the data lines close to the first substrate and insulated from the data lines;

a first side of each sub-pixel in the first direction (Y) is adjacent to the common lines, and a second side of each sub-pixel in the first direction (Y) is adjacent to the scan lines;

each scan line is connected to a gate of the transistor of each sub-pixel located at the same side thereof in the first direction (Y) and adjacent thereto; and each common line is connected to a common electrode of each sub-pixel located at the same side thereof in the first direction (Y) and adjacent thereto.

17. The array substrate according to claim 16, wherein a portion of each scan line constitutes a gate of the transistor, and the common electrode is in contact with the common line.

* * * * *